United States Patent
Augusto (10) Patent No.: US 8,436,288 B2
(45) Date of Patent: May 7, 2013

(54) IMAGE SENSORS WITH PHOTO-CURRENT MODE AND SOLAR CELL OPERATION

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 435 days.

(21) Appl. No.: 12/765,936

(22) Filed: Apr. 23, 2010

(65) Prior Publication Data

US 2010/0270459 A1 Oct. 28, 2010

Related U.S. Application Data

(60) Provisional application No. 61/172,693, filed on Apr. 24, 2009.

(51) Int. Cl.
*H01L 27/00* (2006.01)

(52) U.S. Cl.
USPC .............. 250/208.1; 250/214.1; 320/101; 348/294

(58) Field of Classification Search ........... 250/208.1, 250/214.1, 214 R, 214 DC, 203.4; 348/297, 348/298, 302–304, 307–309, 294, 281; 320/101
See application file for complete search history.

(56) References Cited

U.S. PATENT DOCUMENTS

| | | |
|---|---|---|
| 6,943,051 B2 | 9/2005 | Augusto |
| 7,153,720 B2 | 12/2006 | Augusto |
| 7,265,006 B2 | 9/2007 | Augusto |
| 2002/0018131 A1* | 2/2002 | Kochi ........................... 348/304 |
| 2007/0290265 A1 | 12/2007 | Augusto |
| 2010/0219789 A1* | 9/2010 | Bermak et al. ................ 320/101 |

FOREIGN PATENT DOCUMENTS

WO 2004/027879 4/2004

\* cited by examiner

*Primary Examiner* — Francis M Legasse, Jr.
(74) *Attorney, Agent, or Firm* — Sturm & Fix LLP (57) ABSTRACT

A photo-current mode of operation is disclosed for Full Frame CCDs, and Frame-Transfer CCDs, that is suitable for electrical power generation, when not in operation for image sensing, and for Interline-Transfer CCDs, that is suitable for image sensing, and also suitable electrical power generation, when not in operation for image sensing. Further, CMOS Image Sensors (CIS), including 1T Passive Pixels, or 1T Avalanche Photo-Diode Pixels, in which all pass transistors in the matrix are turned ON simultaneously thereby allowing the photo-current produced by each photo-diode in each pixel to flow towards the periphery where suitable circuitry will handle the photo-current for electrical power generation and/or storage. Also, CMOS Image Sensors (CIS), including any Active Pixel Sensor (APS) design, such as the 3T, or 3T Log, or 4T, or 5T, wherein each column-parallel VDD line connecting the Reset Transistors, or the Log Transistors, in a single column of pixels, to column-parallel circuitry at the edge of the pixel matrix, is connected through multiple pass transistors, to different column-parallel blocks of circuitry that are selected alternatively, and that include (1) a VDD voltage source for standard image sensing operation, (2) a block of circuitry suitable to handle photo-current signals for image sensing purposes, and (3) a block of circuitry that is suitable to handle photo-current for electrical power generation and/or storage purposes.

1 Claim, 7 Drawing Sheets

IMAGE SENSORS WITH PHOTO-CURRENT MODE AND SOLAR CELL OPERATION

CROSS REFERENCE TO RELATED APPLICATIONS

This application claims priority from U.S. Provisional Application Ser. No. 61/172,693 filed Apr. 24, 2009, which provisional application is incorporated herein by reference in its entirety.

BACKGROUND OF THE INVENTION

The present invention relates to image sensors in general, and in particular to new designs of pixel, column circuitry, and matrix controller, that enable image sensors to operate in a photo-current mode. The photo-current mode can be used for imaging purposes to expand the intra-scene dynamic range, and also to enable the entire sensor matrix to operate as a "pixelated" solar cell.

With the exception of the 3T Logarithmic pixel, which is not the most widely used CMOS pixel design, none of the other conventional CMOS Image Sensors (CIS), are capable of operating in a photo-current mode for image sensing purposes.

None of the conventional image sensors, CCDs and/or CIS, make use of the photo-diode in each pixel cell to generate electrical power, when not in use for image sensing. The readout of CCDs proceeds by applying voltage pulses to each pixel, in a particular sequence, in order to shift, sequentially for each pixel, the accumulated charges to the edge of the pixel matrix, and outside the CCD integrated circuit. This type of operation is not suitable to use the accumulated charges to generate electrical power.

The readout of CIS Active Pixel Sensors (APS), regardless if the pixel is a 3T, 4T, 3T Logarithm, etc, is done through the transconductance amplification of a MOSFET inside the pixel, which by definition would not allow photo-current to flow into the column bus.

These basic architectural features of CCDs and CIS APS technologies, do not allow the current collected in the photo-diode of each pixel, to be used for electrical power generation.

The present invention allows many different types of image sensors to use the photo-diode in each pixel for the purpose of generating electrical power, when not in use for image sensing.

The present invention is also applicable to the photo-diode and pixel cell technology described in U.S. Pat. Nos. 6,943,051; 7,153,720; 7265,006, U.S. patent application Ser. No. 11/781,544; WO 2004/027879.

SUMMARY OF THE INVENTION

An object of the present invention is a photo-current mode of operation for Full Frame CCDs, that is suitable for electrical power generation, when not in operation for image sensing.

Another object of the present invention is a photo-current mode of operation for Frame-Transfer CCDs, that is suitable for electrical power generation, when not in operation for image sensing.

Another object of the present invention is a photo-current mode of operation for Interline-Transfer CCDs, that is suitable for image sensing, and also suitable electrical power generation. when not in operation for image sensing.

Another object of the present invention is a CMOS Image Sensor (CIS), comprising 1T Passive Pixels, or 1T Avalanche Photo-Diode Pixels, in which all pass transistors in the matrix are turned ON simultaneously thereby allowing the photo-current produced by each photo-diode in each pixel to flow towards the periphery where suitable circuitry will handle the photo-current for electrical power generation and/or storage.

Yet another object of the present invention is a CMOS Image Sensor (CIS), comprising any Active Pixel design, such as the 3T, or 3T Log, or 4T, or 5T, wherein each column-parallel VDD line connecting the Reset Transistors, or the Log Transistors, in a single column of pixels, to column-parallel circuitry at the edge of the pixel matrix, is connected through multiple pass transistors, to different column-parallel blocks of circuitry that are selected alternatively, and that include (1) a VDD voltage source for standard image sensing operation, (2) a block of circuitry suitable to handle photo-current signals for image sensing purposes, and (3) a block of circuitry that is suitable to handle photo-current for electrical power generation and/or storage purposes.

DETAILED DESCRIPTION OF THE INVENTION

The present invention describes how to adapt conventional image sensors technologies, such as CCDs, 1T PPS, 3T APS, 4T PPD APS, 5T PPD APS, 3T Logarithmic Pixel, etc, to operate in a photo-current mode.

With appropriate operation of the matrix controller (row-selection), and with suitable modifications to column circuitry, the photo-current operation of the modified pixel cells can be used for two purposes:
(1) Extend intra-scene dynamic range;
(2) Operate sensor matrix as a "pixelated" solar cell.

All different types of image sensors listed above can be modified to operate as solar cells. However not all of them can take advantage of a photo-current mode for image sensing, as it might require the matrix to be operated in the "Rolling Shutter" mode.

For CIS APS, the modifications needed for operation in a photo-current mode and/or as solar cells, do not change the number of transistors inside the pixels, only the interconnects to the Reset Transistor (RST), which will now be connected to a "Switched VDD" line, rather than a permanent VDD line that is also shared by other transistors inside the pixels.

At the periphery of the pixel matrix, additional circuitry is necessary to link, the "Switched VDD" to different circuit blocks. Even though the "Switched VDD" lines can be organized in row-parallel or matrix-wide fashion, it is the column-parallel arrangement that provides maximum flexibility for different modes of operation.

At the periphery of the matrix, each column-parallel "Switched VDD" line, will be connected to at least three pass transistors. A first pass transistor links the "Switched VDD" line to an actual VDD source for standard operation of the matrix as an image sensor. A second pass transistor links the "Switched VDD" line to circuitry suitable to handle the photo-current for image sensing purposes. A third pass transistor links the "Switched VDD" line to circuitry suitable to handle the photo-current for electrical power generation and storage purposes. Whenever one pass transistor is ON, the other tow must be OFF.

When the pixels are operated in a photo-current mode for image sensing purposes, the matrix operates in a Rolling Shutter mode, and the signal acquisition/readout progresses in a "row-by-row" fashion, in which all Reset Transistors (RST) of the same row are turned ON, while all others are OFF. At the same time, each column has the second pass-transistor at the column bus is turned ON.

When the pixels are operated in a photo-current mode for solar cell purposes, all Reset Transistors (RST) are turned ON simultaneously. At the same time, each column has the third pass-transistor at the column bus is turned ON.

For pixel with a "Pass Gate" (TG or TX) between the photo-diode and the Reset Transistor, such as the 4T and 5T APS pixels, for the photo-current modes for image sensing and solar cell, the pass gates must be turned ON simultaneously with the Reset Transistors.

3T Logarithmic pixels can also operate in a solar cell mode, and since they operate permanently in a photo-current mode, therefore they require only the appropriate peripheral circuitry to function as solar cells or to be connected to the "Switched VDD" line.

The column circuitry necessary to handle the photo-current mode for image sensing purposes, may have just a single current-amplifier for all pixels in the matrix, or may have column-parallel current amplifiers. The choice between these possibilities depends on several engineering tradeoffs, the former resulting in lower frame rates but without column-related fixed pattern noise, and the latter resulting in high frame rates but with column-related fixed pattern noise.

The present disclosure reviews the most common types of pixel architectures, and shows how they can be modified to allow a photo-current mode, and whether that mode is suitable for solar cell operation only, or if it can also be used for image sensing. This will be followed by a section on pixel matrix and column circuitry suitable for the photo-current mode, both for image sensing and for solar cell operation.

Pixel Architectures

1. Full-Frame CCD

Figure 1A:
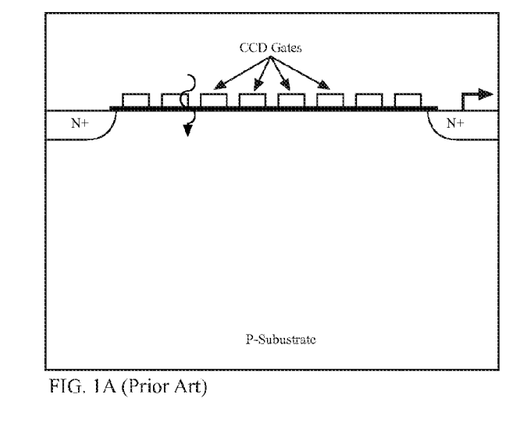
FIGS. 1A & 1B (Prior Art)—schematic cross section of photo-diode and schematic circuit diagram, respectively, of pixel cell of a Full Frame CCD.
Figure 1B:
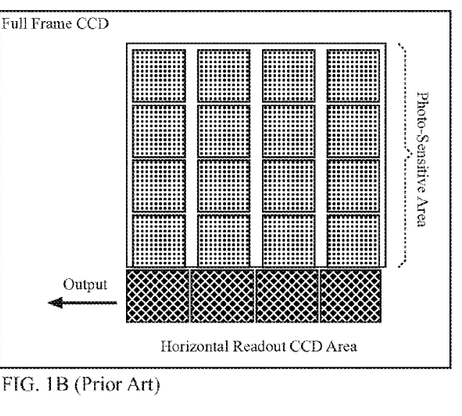

With this technology, shown in FIGS. 1A & 1B, it is not possible to use photo-current for image sensing purposes, because reading out the photo-current from a given row cannot be done without also turning ON all the pixels in the rows in-between the desired row and the periphery of the pixel matrix.

However, it is possible to operate a photo-current mode for solar cell purposes, without any modification to the "pixel cell", by simply turning ON (and remain statically ON) all pixels cells in all rows. The charges generated at each and every pixel are combined and continuously readout to the periphery of the sensing matrix. This static operation is quite different from the configuration needed for the normal operation of Full-Frame CCDs for imaging purposes, which consists in a synchronized, pulse-driven, charge readout process from an individual photo-sensitive site (photo-diode or photo-gate).

In conventional CCDs, this charge flux is moved off chip for signal processing. For the purposes of solar cell operation, the charge flux can be directed to appropriate circuitry that will perform voltage conversion and interface with a battery for storage of that charge, for example.

2. Frame-Transfer CCD

Figure 2A:
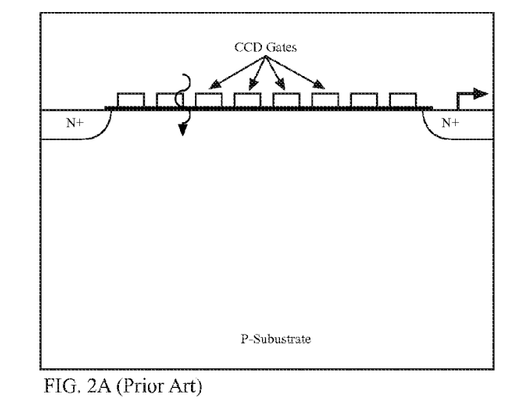
FIGS. 2A & 2B (Prior Art)—schematic cross section of photo-diode and schematic circuit diagram, respectively, of pixel cell of a Frame Transfer CCD.
Figure 2B:
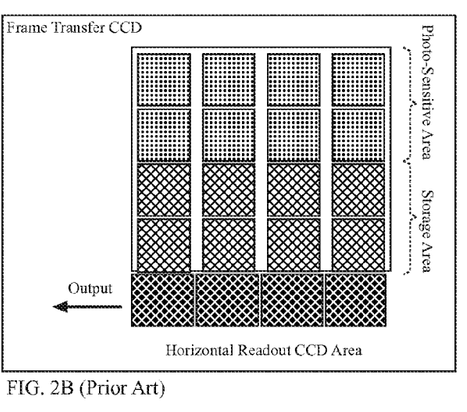

Similarly to the Full-Frame CCD, and for the same reasons, this type of imager (FIGS. 2A & 2B) cannot have a photo-current image sensing mode, but can use photo-current for solar cell operation. This can be done by simply turning ON all gates (which remain statically ON) of all photo-sensitive sites, and also all gates of the storage area, thereby allowing the charge flux generated in the photo-sensitive area to flow directly into the output line, which must also have all its gates statically ON.

3. Interline-Transfer CCDs

With this type of CCDs (FIGS. 3A & 3B), a photo-current mode for image sensing can be implemented, by simply operating the sensor matrix controller in a "Rolling Shutter" mode, in which readout is performed in a row-by-row fashion, but in parallel for all the pixels in the selected row. This is possible by statically turning ON all gates in each and every Interline-Transfer vertical shift register, whenever a given row of pixels is selected, i.e., the CCD gates are turned ON for all pixels in that row. The time interval during which a given row is selected, determines the time interval during which the photo-current is sampled, in parallel for all pixels in that row.

Figure 3A:
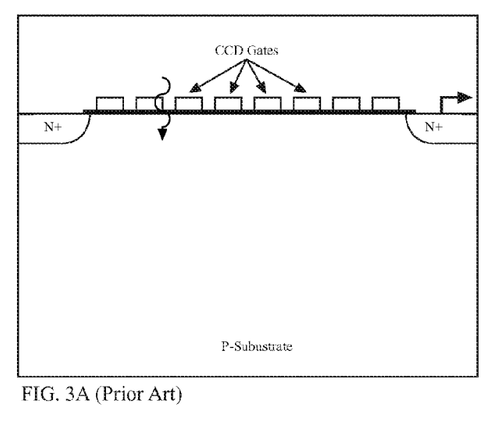
FIGS. 3A & 3B (Prior Art)—schematic cross section of photo-diode and schematic circuit diagram, respectively, of pixel cell of a Interline Transfer CCD.
Figure 3B:
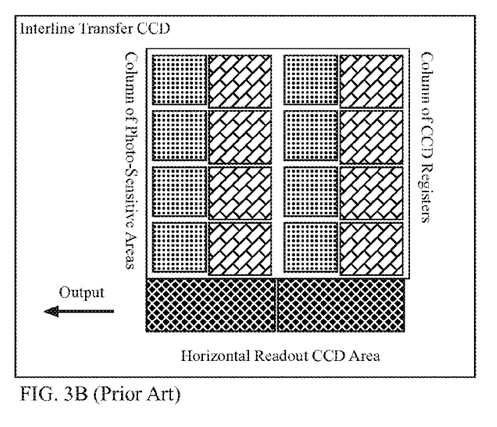

The sampling time of the photo-current should not be confused with a sampling time (time integration or shutter window) of the photon-flux, such as it is done with an "accumulation of charges" mode. A clear difference that illustrates this point, is that for a constant light flux, the value of the photo-current does not change for different sampling times of said photo-current, provided that the sampling time is sufficiently long and thus considered in "equilibrium" (as opposed to capturing a transient condition).

This requires column-parallel output lines to carry the photo-current from each column (from each pixel of the selected row) off chip for suitable signal processing. This could be problematic for stand alone CCDs, but it is straightforward to do for hybrid CCD/CMOS integration schemes, for example using 3D wafer stacking, which would likely be used with "rear illumination" of the CCD.

In a photo-current operation for solar cell purposes, everything is simplified in the sense that all rows are selected simultaneously, and there is no requirement for column-parallel output lines.

Therefore, for the solar cell operation there is no requirement to change the periphery of the CCD sensor matrix.

4. CMOS 1T Passive Pixel Sensor (1T PPS)

This pixel architecture does not need to be modified to be operated in the photo-current mode. A photo-current mode for imaging purposes is implemented by operating the matrix controller in the "Rolling Shutter" mode, and by having column-parallel output amplifiers, or column-parallel ADCs.

The solar cell operation can be implemented with 1T PPS having a serial readout circuitry, or having column-parallel readout circuitry.

A solar cell operation is implemented by statically turning ON all Row-Select transistors in the sensor matrix and have column-parallel pass-transistors that direct the photo-generated currents towards suitable circuitry that interfaces with energy storage (e.g., a battery). There may, or may not, be a need for voltage conversion before interfacing with a battery.

5. CMOS 3T Active Pixel Sensor (3T APS)

Figure 9:
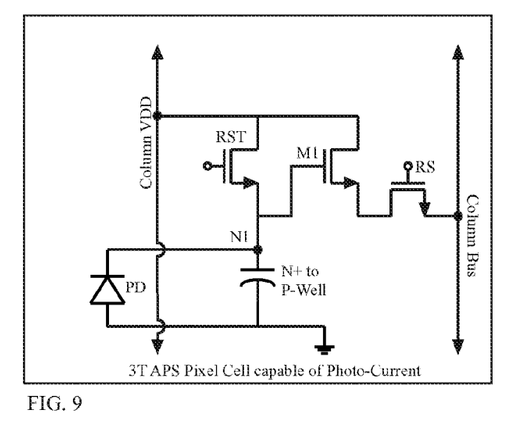
FIG. 9—schematic circuit diagram of 3T APS pixel cells capable of operating in a photo-current mode and solar cell mode.

The CMOS 3T APS pixel cell (FIGS. 4A & 4B) can be operated in a photo-current mode. A photo-current mode for imaging purposes is implemented by operating the matrix controller in the "Rolling Shutter" mode, and by modifying the connection of the Reset Transistor (RST): rather than hardwiring RST to a matrix-wide or row-wide, fixed voltage supply (VDD), the RST will be connected to column-parallel lines that can alternatively be connected to the conventional voltage supply (VDD) or to a column-parallel block of circuitry that can handle a photo-current signal (such as an analog current amplifier or an ADC capable of quantizing current signals). The modified pixel cell is shown in FIG. 9

Figure 4A:
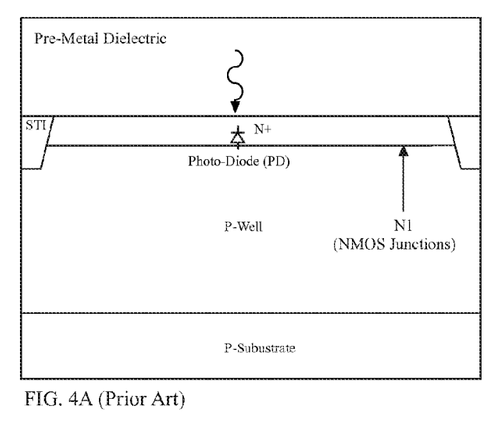
FIGS. 4A & 4B (Prior Art)—schematic cross section of photo-diode and schematic circuit diagram of pixel cell of 3T APS.
Figure 4B:
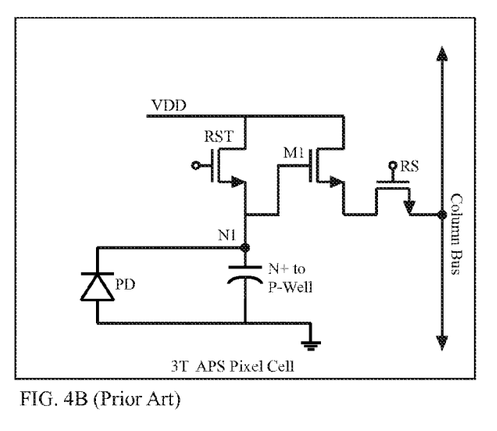

For solar cell operation, it is enough to add a third connection possibility to the column-parallel lines connecting to the RSTs to (on-chip or off-chip) circuitry that can interface to a battery for recharging, with or without voltage conversion.

If photo-current was only to be used for solar cell operation, then the RSTs could be connected to matrix-wide lines that can alternatively be connected to VDD or to (on-chip or off-chip) circuitry that can interface to a battery for recharging, with or without voltage conversion.

6. CMOS 3T Logarithmic Pixel Cell

Figure 5A:
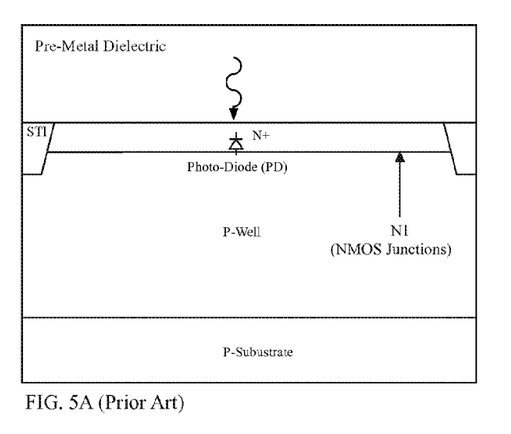
FIGS. 5A & 5B (Prior Art)—schematic cross section of photo-diode and schematic circuit diagram of pixel cell of 4T PPD.
Figure 5B:
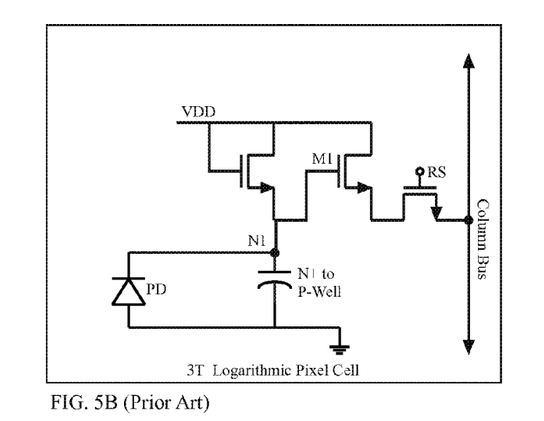
Figure 10:
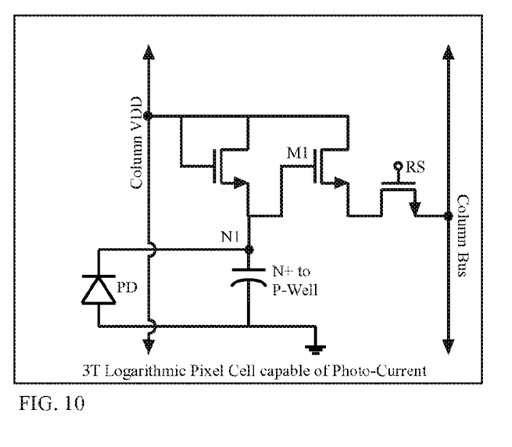
FIG. 10—schematic circuit diagram of 3T Logarithmic pixel cells capable of operating in a photo-current mode and solar cell mode.

The standard CMOS 3T Logarithmic pixel cell (FIGS. 5A & 5B) by its nature is operated in photo-current mode. For solar cell operation, the solution is similar to that for 3T APS. The modified pixel cell is shown in FIG. 10.

7. CMOS 4T Pinned Photo-Diode (PPD) Active Pixel Sensor (APS).

Figure 6A:
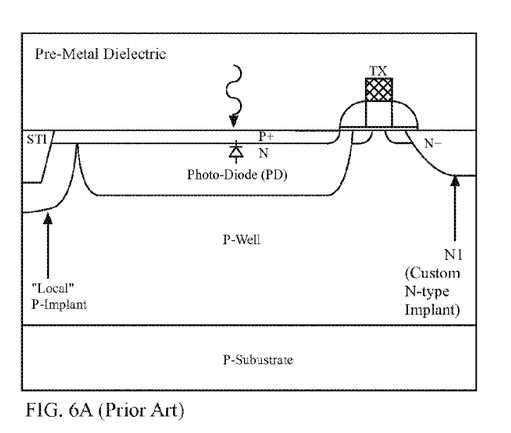
FIGS. 6A & 6B (Prior Art)—schematic cross section of photo-diode and schematic circuit diagram of pixel cell of 5T cell(s).
Figure 6B:
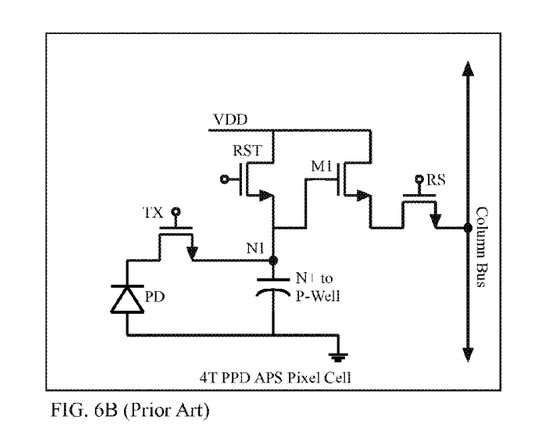
Figure 11:
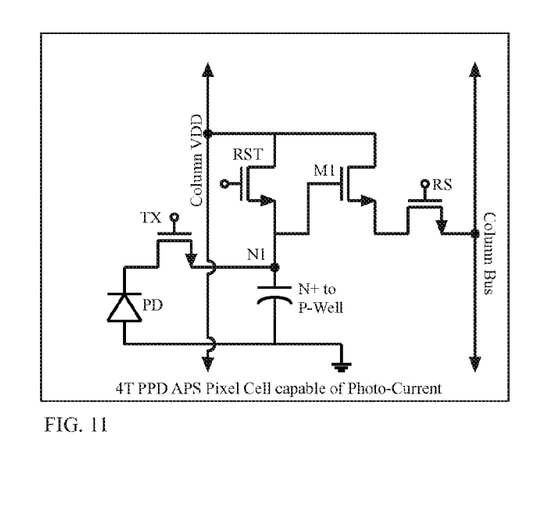
FIG. 11—schematic circuit diagram of 4T PPD APS pixel cells capable of operating in a photo-current mode and solar cell mode.

The 4T PPD APS pixel cell (FIGS. 6A & 6B) can be operated in a photo-current mode. The solution for 4T PPD APS is similar to that for 3T APS, with the difference that there is a transfer gate (TX) in-between the RST and the photo-diode. To operate the 4T pixels in the photo-current mode, the transfer gate (TX) must be ON. For solar cell operation, all Row-Select transistors, and all TX transistors must be statically ON. The modified pixel cell is shown in FIG. 11.

8. CMOS 4T & 5T Pinned Photo-Diode (PPD) Active Pixel Sensor (APS).

Figure 7A:
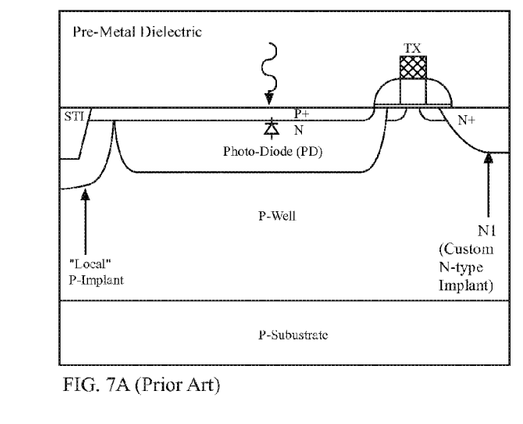
FIGS. 7A & 7B (Prior Art)—schematic cross section of photo-diode and schematic circuit diagram of pixel cell of 3T Logarithmic APS.
Figure 7B:
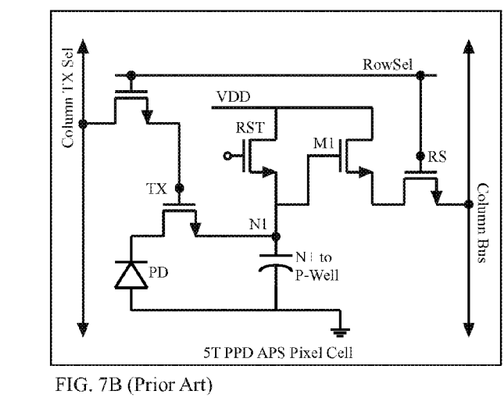
Figure 12:
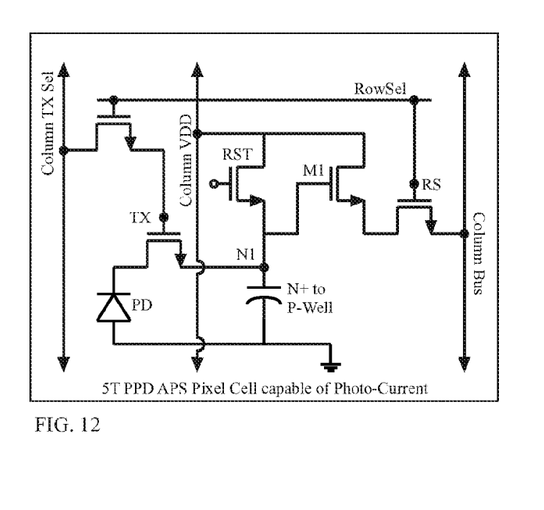
FIG. 12—schematic circuit diagram of 5T PPD APS pixel cells capable of operating in a photo-current mode and solar cell mode.

This type of pixel architecture (FIGS. 7A & 7B) can also be operated in a photo-current mode. The solution for 5T PPD APS is similar to that for 4T PPD APS, with the difference that there is an extra gate that controls the transfer gate (TX) in-between the RST and the photo-diode. To operate the 5T pixels in the photo-current mode, the transfer gate (TX) must be ON, and the column-parallel TX signal must also be ON. For solar cell operation, all Row-Select transistors and all column-parallel TX signals must be statically ON. The modified pixel cell is shown in FIG. 12.

9. CMOS 1T APD

The 1T APD pixel architecture (FIGS. 8A & 8B) does not need any modification to operate in a photo-current mode. Columns can be biased independently from each other. To operate as a solar cell, in each column, the "Column VCC" line and the "Column Bus" need to have pass-transistors connected at the appropriate points in order to divert the photo-current to suitable circuitry interfacing with a battery.

Figure 8A:
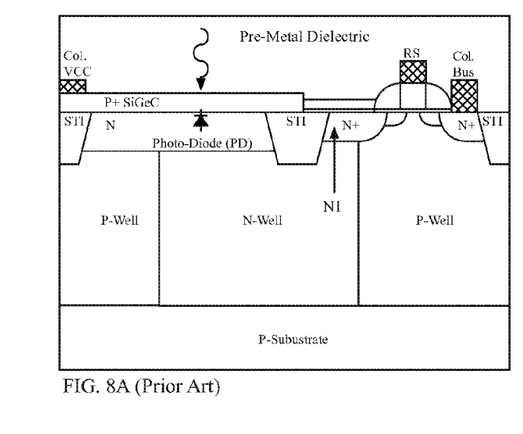
FIGS. 8A & 8B (Prior Art)—schematic cross section of photo-diode and schematic circuit diagram of pixel cell of QS SiGeC APD+ 1T.
Figure 8B:
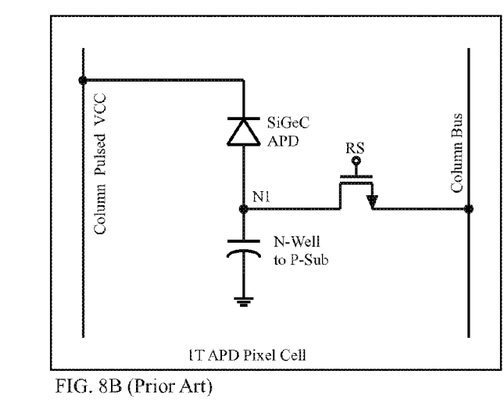

Of all the pixel cells reviewed in this disclosure, only this one, the 1T APD pixel cell can be connected in series to increase the open circuit voltage (Voc). Several columns of pixel could be connected this way, to further increase the Voc. The pass transistor SC2 or SC4, are not required to operate at the full voltage of the increased Voc, since the well in which they are made, could be independently biased to the a suitable voltage level. Ultimately, using only on-chip circuitry, the maximum Voc that is practical to generate by a series connection of several columns of pixels, is going to be limited by the available on-chip switching devices (MOSFETs, and/or BJTs and/or HBTs), and the maximum voltage that they are able to operate under, or have control over.

Pixel Matrix Architectures

Figure 13:
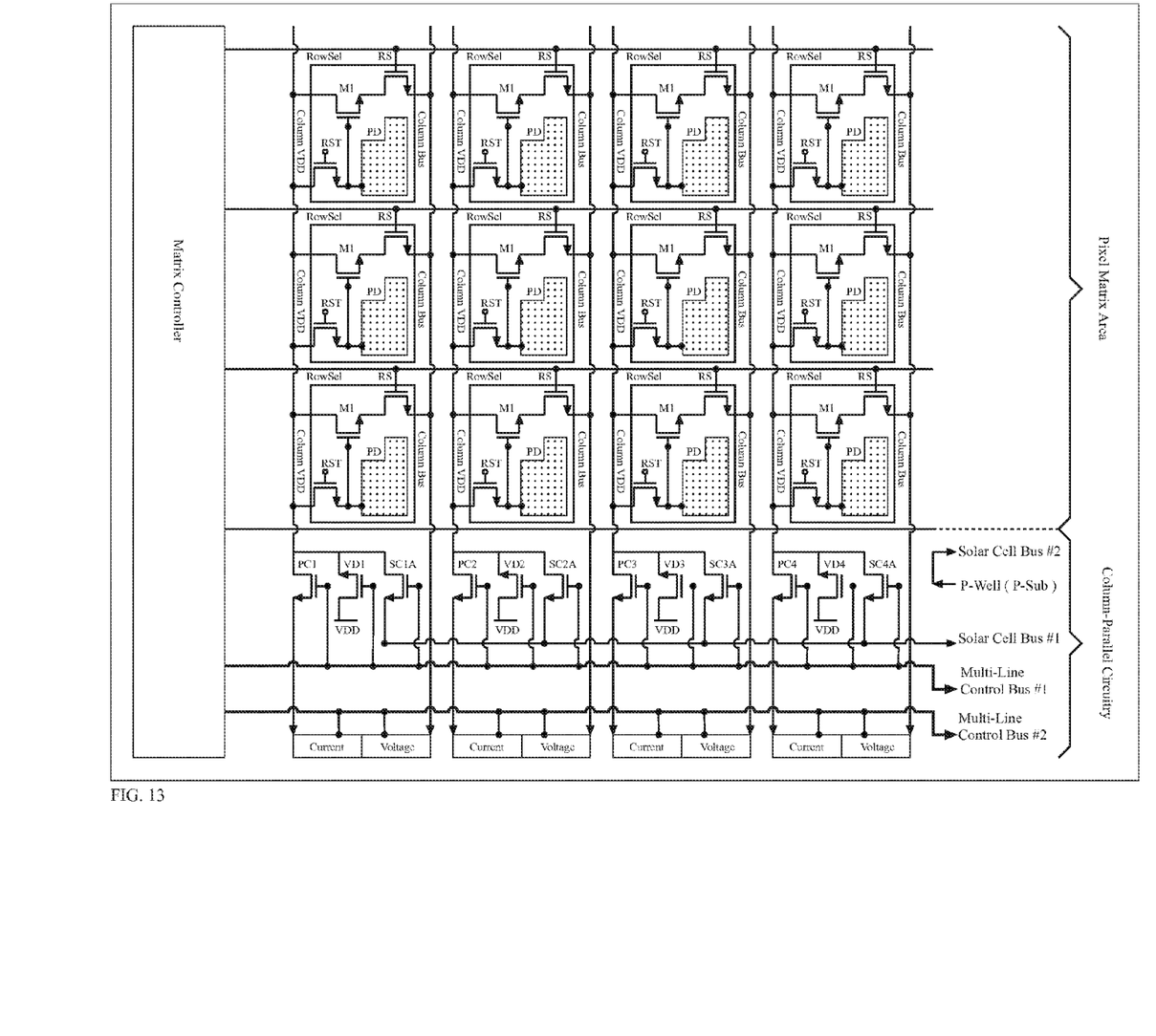
FIG. 13—schematic circuit diagram of pixel matrix, composed of 3T APS pixel cells, enabling photo-current imaging mode and solar cell operation.

All the aforementioned pixel architectures, with the exception of the 1T SiGeC APDs, share the following characteristics:

All photo-diodes (or photo-gates) have a common bottom electrode, formed by the P-Well/P-Sub regions, while the top electrodes are pixel-specific N+ diffusion regions. For CMOS imagers, these are the S/D regions of Row Select transistors. Therefore, for solar cell operation, any two groups of pixels, made on the same substrate, can only be connected in parallel, and could be implemented, for example, by making the appropriate connections at the bottom of the sensor matrix, as shown in FIG. 13.

This topological characteristic would still exist even if there was a Deep N-Well underneath the P-Wells, or if the polarities of the photo-diode junctions were reversed (P+ diffusion on N-Well) and the polarities of the in-pixel MOSFETs were also reversed (PMOS rather than NMOS).

This topological barrier can be bypassed by involving more sophisticated circuitry, on-chip or off-chip.

However, this is not the situation with the 1T SiGeC APD pixel architecture, since the bottom electrode of the photo-diode is a N-Well that can be independently biased from adjacent N-Wells (from nearest neighbor pixels), and since the top electrode is a patterned SiGe (SiGeC) epitaxial film. The patterning of the SiGe (or SiGeC) film will typically be done in a way such that adjacent columns of pixels can have their top electrodes biased independently from each other. Therefore, columns of pixels could be connected in series.

Figure 14:
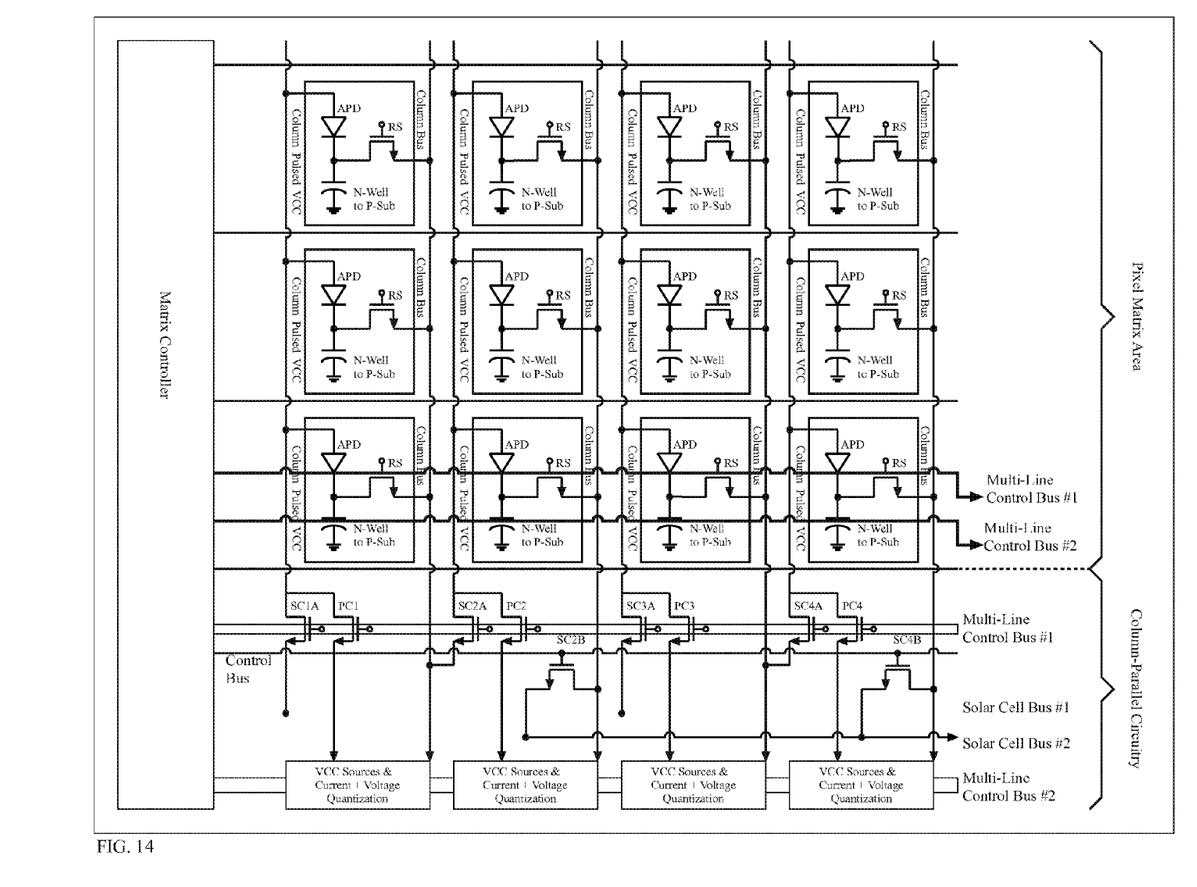
FIG. 14—schematic circuit diagram of pixel matrix, composed of 1T APD pixel cells, enabling photo-current imaging mode and solar cell operation. The configuration of the circuitry at the bottom of the pixel matrix, enables the series connection of two columns of pixels for doubling the open circuit voltage (Voc).

The series connection of solar cell junctions is a simple way to increase maximum open circuit voltage (Voc) of the solar cell, with the associated decrease in short-circuit current (Isc.). Given that the maximum open circuit voltage (Voc) possible with silicon solar cells is around 1.1V (and slightly less for SiGe or SiGeC), it is feasible to connect a plurality of columns of pixels in series, in order to increase the Voc, and still be compatible with "high voltage MOSFETs" used to handle I/O signals, which typically operate at 3.3V and above. For example, rather than having the parallel connection of all columns, the parallel connection could be between pairs (odd and even) of columns, as shown in FIG. 14, resulting' in a Voc that is twice (around 2.2V) of that with all columns in parallel. Other interconnection schemes, could result in still larger Voc.

Matrix Controller Architectures

The operation of a pixel matrix in a photo-current mode for imaging purposes, requires the matrix controller to operate in the Rolling Shutter mode, in which signal acquisition and readout are performed on a "row-by-row" mode. A Rolling Shutter is commonly used for 3T pixels. It is also straightforward to operate 4T and 5T pixels with a Rolling Shutter. Therefore, conventional matrix controllers already have the ability to operate image sensors in this mode.

The operation of a pixel matrix in a photo-current mode for solar cell purposes, requires the row-select transistors in every pixel in the matrix to be switch "ON", and remain statically "ON". Therefore, for solar cell operation, the only special requirement for the matrix controller is to be able to "select" all rows simultaneously.

Description of New Modes of Operation

FIG. 13 and FIG. 14 show exemplary schemes for interconnecting the several column buses to column-parallel circuitry, that enable the pixels to be operated in the photo-current mode for image sensing purposes, and to be operated in the photo-current mode for power generation (solar cell) purposes.

FIG. 13, shows an implementation in which all columns of pixels and respective blocks of column-parallel circuitry are identical, and share the same orientation or alignment. This implementation shows the modified 3T APS pixels from FIG. 9, but it could also depict modified 3T Logarithmic pixels of FIG. 10, or the modified 4T PPD APS pixels of FIG. 11, or the modified 5T PPD APS pixels of FIG. 12.

In FIG. 13, at the bottom of the pixel matrix, the "Multi-Line Control Bus #1" enables the Matrix Controller to command all sets of pass transistors positioned between the pixel matrix and the blocks of column-parallel circuitry that handle voltage and/or current signals. The "Multi-Line Control Bus #2" enables the pixel Matrix to interact with the blocks of column-parallel circuitry themselves.

Referring to FIG. 13, the connections between a column of pixels and a block of column-parallel circuitry include at 4 transistors: PCx, VDx, SCxA, SCxB, where "x" is the column number.

When VDx is "ON" and PCx, SCxA, SCxB are "OFF", the column "x" of pixels has its "Column VDD" bus connected to the VDD voltage supply, and the pixels operate in their standard manner.

When PCx is "ON", and VDx, SCxA, SCxB are "OFF", the COILImn "x" of pixels has its "Column VDD" bus connected to the block of column circuitry that handles photo-current signals, and the pixels can operate in a photo-current mode for image sensing purposes. The photo-current signal could be handled by different types of circuitry at the periphery. The figures show an example in which the signal is quantized in column-parallel fashion.

When SCxA and SCxB are "ON" and VDx and PCx are "OFF", the column "x" of pixels has its "Column VDD" bus connected to the "Solar Cell Bus #1". "Solar Cell Bus #2" is connected to the common bottom electrode to all pixels, i.e., the P-Well(s) for all NMOS-based photo-diodes, even if there is a Deep-N-Well underneath the P-Well(s). In the absence of a Deep-N-Well underneath the P-Wells, the P-Wells are all directly connected to the P-Substrate (P-Sub), which is the situation depicted in FIG. 13.

FIG. 14 shows an implementation incorporating the 1T APD pixel design of FIG. 8A and FIG. 8B. which does not require modification to operate in photo-current mode for image sensing or solar cell operation. In this particular implementation all columns of pixels are identical, and share the same orientation or alignment. By design, the 1T APD pixel allows photo-current modes, since there is no transconductance amplification. Also, in a typical implementation of this pixel architecture, pixels in a row do not have any common electrode, which is necessary to make possible the series connection of 2 columns, and thus double the Open Circuit Voltage (Voc).

FIG. 14 also shows an exemplary implementation of an interconnecting scheme that enables the increase of Voc when the pixel matrix operates as a solar cell. This is why the connectivity between columns of pixels and blocks of column circuitry are identical only for pairs of columns (for example, "1 & 2", "3 & 4", etc.), not on a "column-by-column" basis. This is what enables the series connection of two columns of pixels: col. 1 & col. 2, col. 3 & col. 4, col. 5 & col. 6, etc. In order to have a series connection of 4 columns (for example), the connectivity between columns of pixels and column circuitry would be identical for each group of 4 columns of pixels.

In FIG. 14, at the bottom of the pixel matrix, the "Multi-Line Control Bus #1" enables the Matrix Controller to command all sets of pass transistors positioned between the pixel matrix and the blocks of column-parallel circuitry that handle voltage and/or current signals. The "Multi-Line Control Bus #2" enables the pixel Matrix to interact with the blocks of column-parallel circuitry themselves.

Referring to FIG. 14, the connections between a column of pixels and a block of column-parallel circuitry include at 2 transistors per column of pixels, plus a 3rd transistor to enable a series connection between 2 columns.

When PCx is "ON", and SCxA, SCxB are "OFF", the column "x" of pixels has its "Column Pulsed VCC" bus connected to the respective block of column circuitry. Each block of column circuitry comprises a set of voltage sources to be applied to the APD through the "Column Pulsed VCC" bus, as well as an ADC and associated circuitry to perform quantization of charge, voltage and current signals, regardless of whether the signals are carried by just the "Column Pulsed VCC" bus, or the "Column Bus", or both.

When SCxA and SCxB are "ON" and PCx is "OFF", the description of the operation has to be separated for odd and even numbers of columns of pixels.

Where "x" is an odd number. the column "x" of pixels, has its "Column Pulsed VCC" bus connected (through SCxA) to "Solar Cell Bus #1".

Where "x" is an even number, the column "x" of pixels, has its "Column Pulsed VCC" bus connected (through SCxA) to the "Column Bus" of the "x-1" column of pixels. Concomitantly, SCxB connects the "Column Bus" of Column "x" to "Solar Cell Bus #2".

In FIG. 13 and FIG. 14, the pass transistors connecting the pixel matrix to the blocks of column circuitry and/or to the solar buses, can be "Zero VT" or "Dynamic VT" devices, in order to minimize the impact of their presence in the path of the signals.

The invention claimed is:

1. A CMOS Image Sensor, comprising:

Active Pixels, including 3T, or 4T Pinned Photo-Diode, or 5T in which the Reset Transistor (RST) in each pixel has a first source/drain terminal connected to elements inside the pixels and has a second source/drain terminal connected to the first source/drain terminals of multiple pass-transistors located at the periphery of the pixel matrix through column-parallel, row-parallel, or matrix parallel, metal lines;

a first pass transistor whose second source/drain terminal is connected to a VDD voltage source;

a second pass transistor whose second source/drain terminal is connected to a first block of circuitry suitable to process photo-current signals for image sensing purposes; and a third pass transistor whose second source/drain terminal is connected to a second block of circuitry suitable to process photo-current signals for electrical power generation purposes.

* * * * *